United States Patent
Alcoe et al.

[11] Patent Number: 5,947,750
[45] Date of Patent: *Sep. 7, 1999

[54] ELASTOMERIC STRUCTURE WITH MULTI-LAYERED ELASTOMER AND CONSTRAINING BASE

[75] Inventors: David James Alcoe, Vestal; William Louis Brodsky, Binghamton; David Vincent Caletka, Apalachin, all of N.Y.

[73] Assignee: International Business Machines Corporation, Armonk, N.Y.

[*] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/848,949

[22] Filed: Apr. 30, 1997

Related U.S. Application Data

[63] Continuation of application No. 08/587,078, Jan. 16, 1996.

[51] Int. Cl.⁶ ........................................ H01R 9/09
[52] U.S. Cl. ................................. 439/67; 439/493
[58] Field of Search .......................... 439/66, 67, 91, 439/493

[56] References Cited

U.S. PATENT DOCUMENTS

| | | | |
|---|---|---|---|
| 3,065,446 | 11/1962 | Robb et al. | 439/496 |
| 4,538,865 | 9/1985 | Wakabayashi et al. | 439/66 |
| 4,602,317 | 7/1986 | Rovnyak et al. | 439/77 |
| 4,647,125 | 3/1987 | Landi et al. | 439/66 |
| 4,770,641 | 9/1988 | Rowlette | 439/91 |
| 4,902,234 | 2/1990 | Brodsky et al. | 439/67 |
| 5,037,312 | 8/1991 | Casciotti et al. | 439/66 |
| 5,059,129 | 10/1991 | Brodsky et al. | 439/67 |
| 5,099,393 | 3/1992 | Bentlage et al. | 361/413 |
| 5,163,834 | 11/1992 | Chapin et al. | 439/66 |
| 5,219,293 | 6/1993 | Imamura | 439/67 |
| 5,350,308 | 9/1994 | Laska et al. | 439/91 |
| 5,385,477 | 1/1995 | Vaynkof et al. | 439/66 |

*Primary Examiner*—Paula Bradley
*Assistant Examiner*—Tho D. Ta
*Attorney, Agent, or Firm*—Scully, Scott, Murphy, & Presser; Lawrence R. Fraley, Esq.

[57] ABSTRACT

An elastomeric structure including two layers, the first having patterned openings therein and adjacent web members, the second including a patterned array of upstanding projections. The openings and projections may be of cylindrical, rectangular, or other configurations and are oriented in highly dense patterns. The elastomeric is positioned with and attached to a base member having a sidewall substantially as high as the corresponding external side surface of the elastomeric's first layer. The sidewall constrains the elastomeric during compression. The invention thereby substantially prevents lateral expansion of the elastomeric's side surface and lateral deflection of both layers, resulting in a uniform distribution of compressive forces on the upstanding projections.

35 Claims, 6 Drawing Sheets

ELASTOMERIC STRUCTURE WITH MULTI-LAYERED ELASTOMER AND CONSTRAINING BASE

This application is a continuation of application Ser. No. 08/587,078, filed Jan. 16, 1996.

TECHNICAL FIELD

This invention relates to elastomeric structures and particularly to such structures that can be used as part of electrical connector assemblies commonly used in electronic packaging assemblies, e.g., those used in information handling systems (computers).

BACKGROUND OF THE INVENTION

Various examples of elastomeric structures, including those used in electrical connectors, are known in the art. The following are representative examples: 1) U.S. Pat. No. 4,538,865 (Wakabayashi, et al) describes the use of press-fit structures to hold an elastomeric member within a second member that limits compression of the elastomeric member; 2) U.S. Pat. No. 4,902,234 (Brodsky, et al) teaches multi-layered elastomeric structures with a force redistribution member, the near incompressible nature of the elastomerics used requiring space to expand laterally during compression; 3) U.S. Pat. No. 5,059,129 (Brodsky, et al) teaches multi-layered elastomeric structures having apertures in the lower layer to limit interaction of pressures between the second layer projections; and 4) U.S. Pat. No. 5,385,477 (Vaynkof, et al) describes buckling of members embedded in an elastomeric member and growth of the elastomeric member when space is provided. The following are further examples: U.S. Pat. No. 3,065,446 (Robb, et al); U.S. Pat. No. 4,647,125 (Landi, et al); U.S. Pat. No. 5,037,312 (Casciotti, et al); U.S. Pat. No. 5,099,393 (Bentlage, et al) and U.S. Pat. No. 5,219,293 (Imamura).

Typically, there are limitations with elastomeric structures such as those described above, including, e.g., the situation in which reducing the hardness of the elastomer by adding foaming agents to the elastomer to increase its compliance in turn increases the material's stress relaxation due to leakage of gases in the foamed elastomer), thereby varying the contact normal force available for a reliable electrical connection. Over-constraining the elastomer or not leaving enough room for it to expand increases the material pressure and, inherently, the resulting contact force due to the incompressible nature of such known elastomeric materials. Another limitation of known elastomeric materials is the possibility of in-plane or lateral growth of such structures due to compression. This in-plane growth can cause positional tolerance and/or alignment problems with other components in a connector system. This growth is caused by an elastomer's Poission's effect, or, in other words, the near incompressibility of homogeneous elastomeric materials, causing expansion in the direction of least work. The in-plane or lateral growth of an elastomeric structure such as the type shown in U.S. Pat. No. 5,059,129 (FIGS. 5 and 6) can cause an additional bending moment in the elastomeric's upstanding projections and first layer. These additional moments are known as column buckling or the "P-delta" effect. As the dimensions "OS" and "PS" in FIG. 7 of U.S. Pat. No. 5,059,129 are reduced or become smaller (e.g., as a result of miniaturization of an electronic package), the cylinder diameter must also become smaller to maintain the most compliant (inverse of spring rate) structure possible. Because of this, the elastic stability of such structures may be reduced, leading to a potential buckling in the structure.

It is one purpose of this invention to teach a means for minimizing the buckling or "P-delta" effect in an elastomeric structure. As an example of how a sparsely connected elastomeric structure can buckle, a single cylinder with no lateral or displacement forces applied (and having a height to diameter aspect ratio of approximately 1.5) can be compressed approximately twenty-five percent of its height without buckling. However, if a similar cylinder is used near the outer edge of a prearranged configuration as shown in FIG. 6 of 5,059,129, with the distance between the cylinders reduced, and the resulting array compressed approximately twenty-five percent, the lateral growth of the array can cause cylinder deformation in a lateral direction, resulting in buckling. This buckling of the cylinder can cause loss of contact normal force, reducing the reliability of the overall contact system.

It is believed that an elastomeric structure capable of overcoming the aforementioned disadvantages associated with known structures would constitute a significant advancement in the art.

DISCLOSURE OF THE INVENTION

It is a primary object of the invention to enhance the art of elastomeric structures, and particularly those capable of usage in electronic packaging assemblies such as those used in information handling systems (computers).

It is another object of the invention to provide an improved electrical connector assembly for use in such electronic packaging assemblies.

It is still another object of this invention to provide an electrical connector assembly that provides sound, effective contact pressure in a reliable manner with reduced tendency for buckling of the elastomeric member.

These and other objects are achieved according to one aspect of the invention through the provision of an elastomeric structure comprising an elastomeric member including a first layer having at least one external side surface, the first layer having a plurality of openings spacedly positioned in the first layer in accordance with a first established pattern and a second layer including a plurality of upstanding projections, selected ones of the upstanding projections each being located adjacent one or more of the openings in the first layer in accordance with a second established pattern. The elastomeric material within the first layer is adapted for deforming and extending into the openings within the first layer during application of force onto the upstanding projections of the second layer. The invention further includes a base member having at least one sidewall defining a cavity within the base member, the first layer of the elastomeric member being positioned within the cavity, the sidewall engaging the external side surface of the first layer of the elastomeric material during the application of force onto the upstanding projections of the second layer to substantially prevent lateral expansion of the external side surface of said first layer and lateral deflection of the first and second layers.

In accordance with another object of the invention there is provided a connector assembly comprising a first circuitized substrate including a first plurality of conductors thereon, a second circuitized substrate including a second plurality of conductors thereon and adapted for engaging the first plurality of conductors, an elastomeric structure including an elastomeric member having a first layer having at least one external side surface, the first layer having a plurality of openings spacedly positioned in the first layer in accordance with a first established pattern and a second layer including a plurality of upstanding projections. Selected ones of the upstanding projections are located adjacent one or more of the openings in the first layer in accordance with a second established pattern. The elastomeric material within the first layer is adapted for deforming and extending into the openings within the first layer during application of force onto the upstanding projections of the second layer. The invention also includes a base member including at least one sidewall defining a cavity within the base member, the first layer of the elastomeric member being positioned within the cavity, the sidewall engaging the external side surface of the first layer of the elastomeric material during application of force onto the upstanding projections of the second layer to substantially prevent lateral expansion of the external side surface of the first layer and lateral deflection of the first and second layers. The upstanding projections are adapted for aligning with respective ones of the conductors of the second circuitized member and engaging the second circuitized member to cause the second circuitized member to exert the force against the conductors of the first circuitized member. The invention also includes means for retaining the elastomeric structure against the second circuitized member.

In accordance with a third aspect of the invention, there is provided an information handling system including a connector assembly which comprises a first circuitized substrate including a first plurality of conductors thereon, a second circuitized substrate including a second plurality of conductors thereon and adapted for engaging the first plurality of conductors, and an elastomeric structure including an elastomeric member having a first layer having at least one external side surface, the first layer having a plurality of openings spacedly positioned in the first layer in accordance with a first established pattern and a second layer including a plurality of upstanding projections, selected ones of the upstanding projections each being located adjacent one or more of the openings in the first layer in accordance with a second established pattern. The elastomeric material within the first layer is adapted for deforming and extending into the openings within the first layer during application of force onto the upstanding projections of the second layer. The invention also includes a base member including at least one sidewall defining a cavity within the base member, the first layer of the elastomeric member being positioned within the cavity, the sidewall engaging the external side surface of the first layer of the elastomeric material during application of force onto the upstanding projections of the second layer to substantially prevent lateral expansion of the external side surface of the first layer and lateral deflection of the first and second layers. The upstanding projections are adapted for aligning with respective ones of the conductors of the second circuitized member and engaging the second circuitized member to cause the second circuitized member to exert force against the conductors of the first circuitized member. The invention also includes means for retaining the elastomeric structure against the second circuitized member.

BEST MODE FOR CARRYING OUT THE INVENTION

For a better understanding of the present invention, together with other and further objects, advantages and capabilities thereof, reference is made to the following disclosure and appended claims in connection with the above-described drawings. Like numerals will be used to illustrate similar elements, including those of the known art and the corresponding, improved elements taught herein.

In the development of a connector assembly, e.g., for use in information handling systems, several electrical parameters must be considered. One such example is the contact resistance of the formed electrical connections. To maintain a gas-tight, low-resistance connection, a minimum contact normal force is generally required for such connections of the pressure application or non-wiping variety. In the present invention, the contact normal force is provided by an elastomeric structure. This structure is preferably aligned with the electrical conductors before, during, and after the compression of the elastomer to generate the contact normal force. If the elastomeric structure's alignment changes relative to the electrical conductors during actuation, generation of the correct contact normal force can be adversely affected, resulting in low, stable contact resistance not being achieved for the desired connections.

Figure 1:
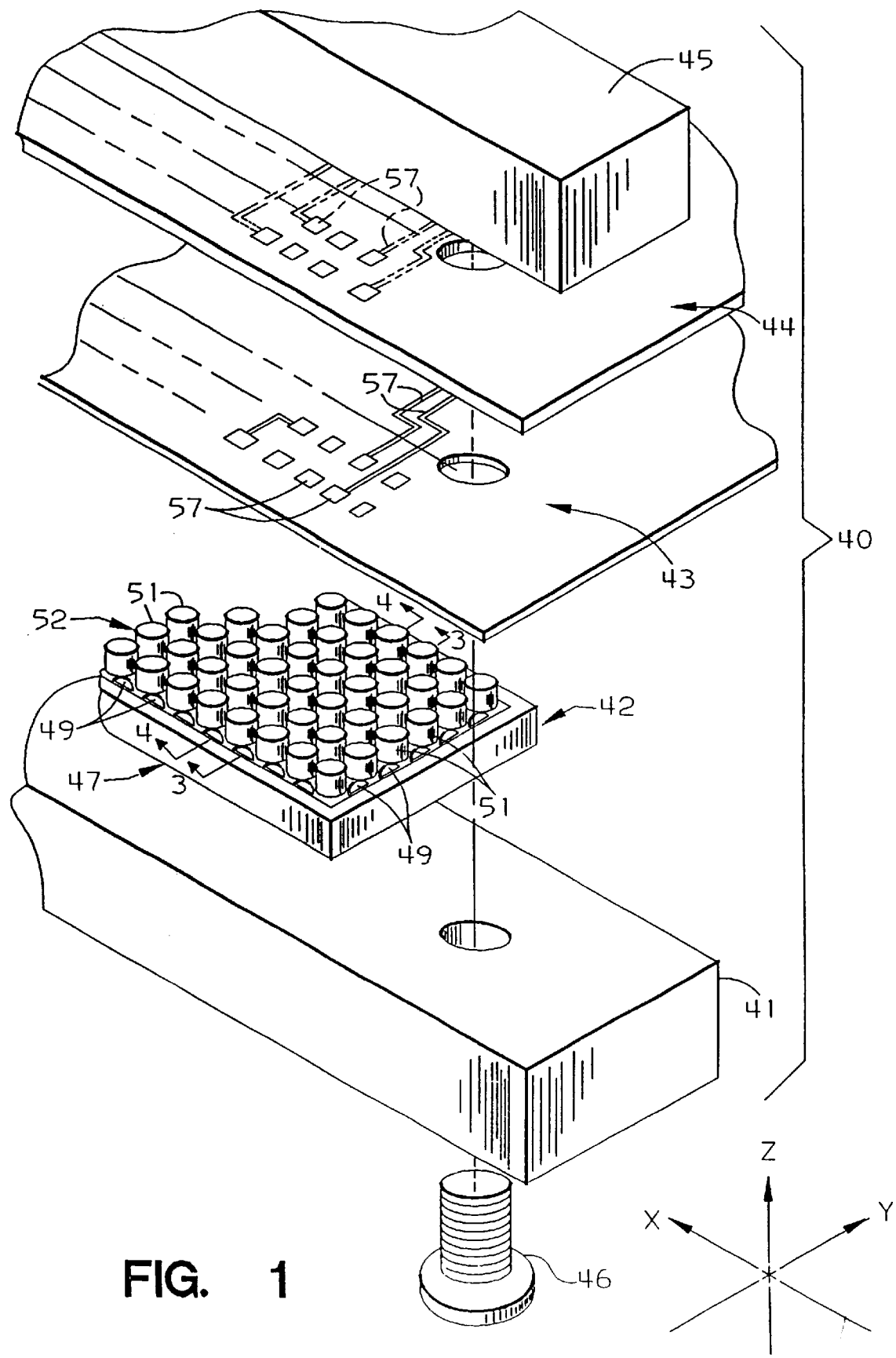
FIG. 1 is a partial, exploded perspective view of an electronic connector assembly including an elastomeric structure in accordance with one embodiment of the invention.

In FIG. 1, an electrical connector 40 is shown in an exploded view. Connector 40 is comprised of an optional support member 41, an elastomer structure 42, a first circuitized member 44, and a second circuitized member 43. Connector 40 may also include a stiffener 45 and screws 46 (only one shown, but two are preferred). Screws 46 can be used to align the members of the connector assembly and also to maintain the connector in an actuated state. Other means, e. g., a clamping apparatus, may be used to provide such actuation.

The first and second circuitized members (44, 43) can be made from a glass reinforced/epoxy resin material (FR-4), polyimide film, ceramic, or other materials commonly used in the art. These substrates, in turn, may include having electrically conductive traces (circuitry) 57 made of copper or similarly conductive material thereon. In a preferred embodiment, circuitized member 44 is comprised of such epoxy resin material and copper circuitry possessing a thickness of about 0.060 to about 0.100 inch. Member 43 is preferably polyimide with a thickness as low as 0.002 inch. In both instances, the conductive circuitry 57 may have a thickness of about 0.0004 to 0.0016 inch. Members as thin as member 43 may also be referred to as flexible circuit members while the resin dielectric substrate is typical of thicker, more rigid printed circuit boards.

Figure 2:
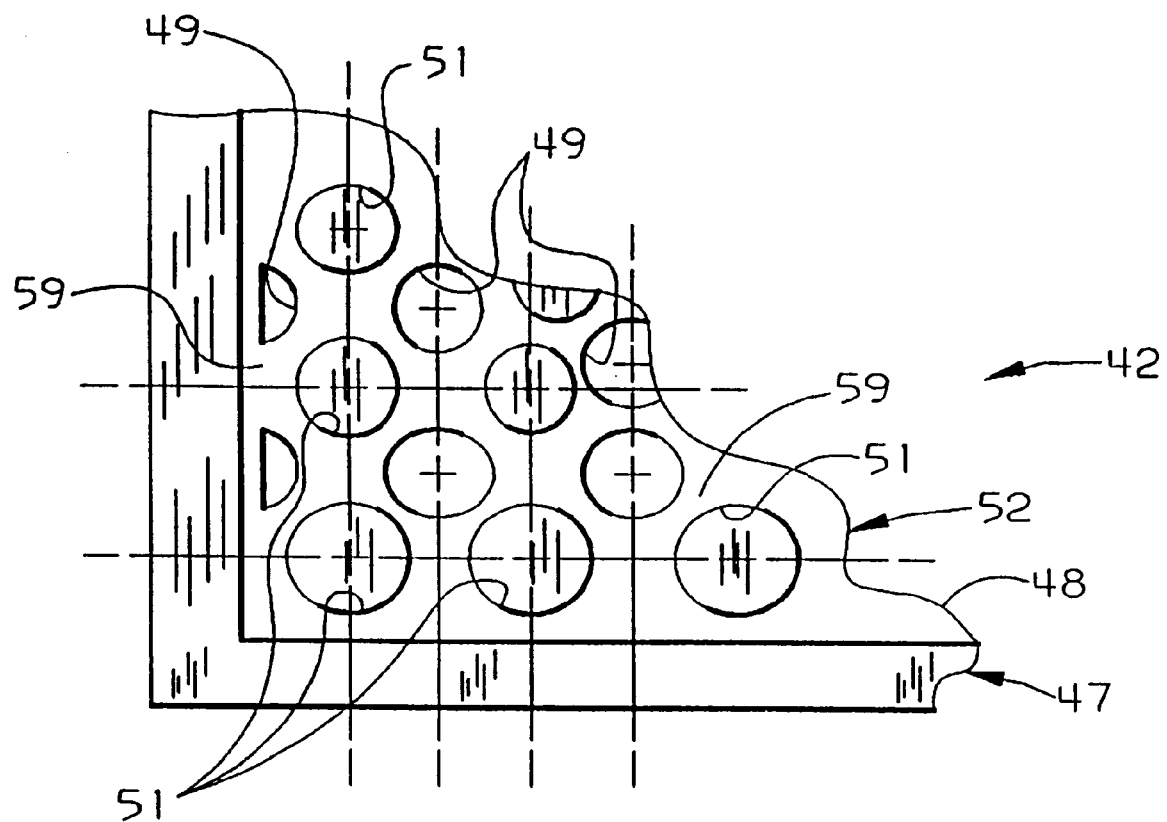
FIG. 2 is a partial top view, on an enlarged scale over FIG. 1, showing a portion of the elastomeric structure shown in FIG. 1.
Figure 2A:
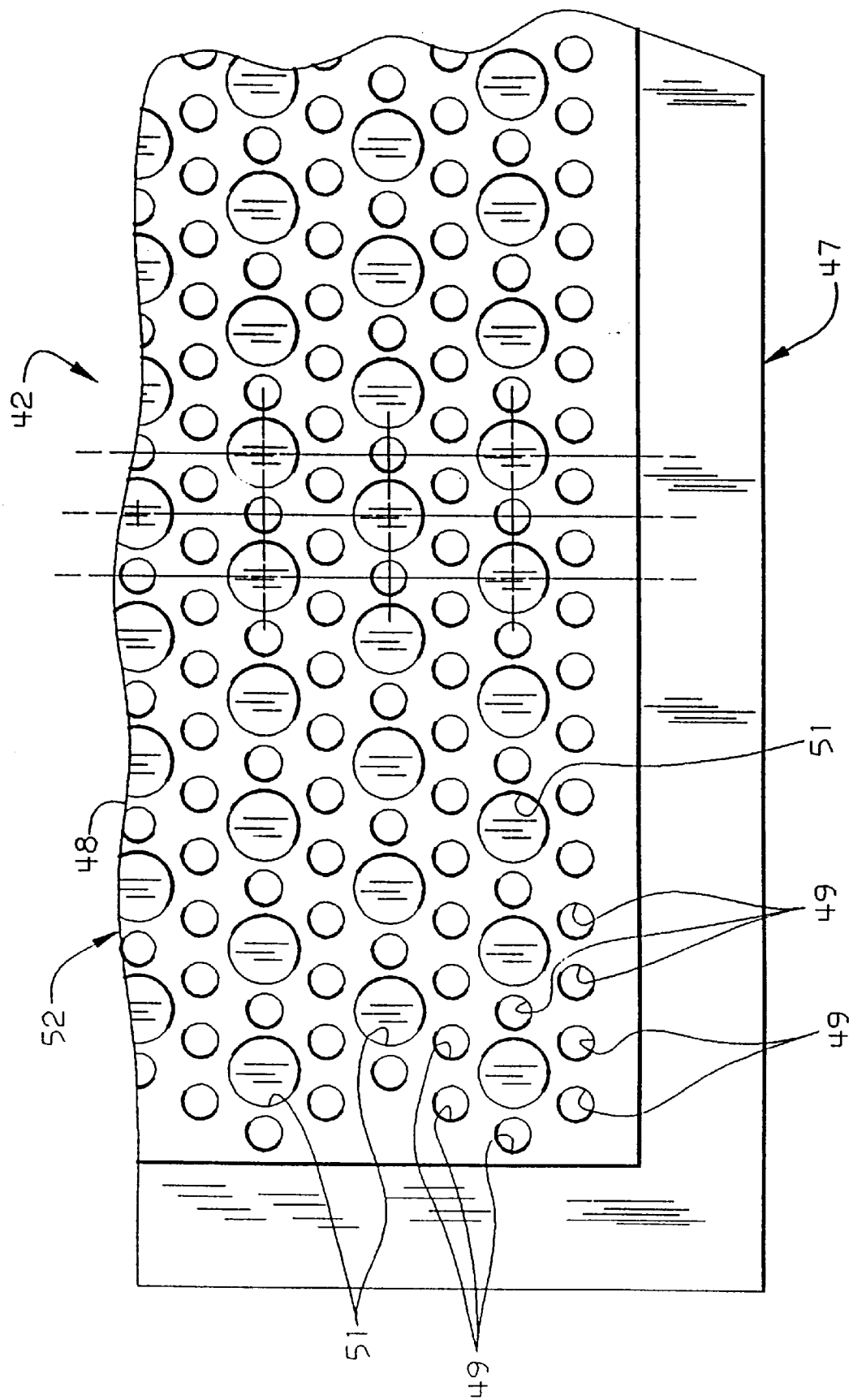
FIG. 2A is a partial top view, also on an enlarged scale over FIG. 1, showing an elastomeric structure in accordance with another embodiment of the invention.

FIG. 2 is a partial top view of elastomeric structure 42 showing a pattern of upstanding projections 51 which form an upper layer 50 of an elastomeric member 52 and a pattern of openings 49 in the elastomeric member's layer 48. The projection pattern may be a substantially rectangular pattern (FIG. 2) having center-to-center spacings of approximately 0.020 by 0.040 inch. It may also comprise a pattern of approximately 0.100 by 0.100 inch, thus being square. As shown in FIG. 2A, the invention is not limited to rectangular patterns. In FIG. 2A, for example, the projections 51 are shown to form a substantially trapezoidal pattern while the openings 49 about each projection may form an annular or hexagonal configuration. As seen, the openings 49 located between two adjacent projections 51 each represent a common opening to both adjacent projections. Both FIG. 2 and 2A patterns may comprise a density of about 100 to about 1,250 projections and a similar number of openings per square inch, thus assuring a structure of relatively high density.

Alternatively, openings 49 of the lower (first) layer 48 and/or upstanding projections 51 of the upper (second) layer 50 (FIG. 3) may be of a shape other than cylindrical (or half-cylindrical in the case of those along the member's periphery). These may even be of a substantially rectangular or ellipsoidal shape.

Figure 3:
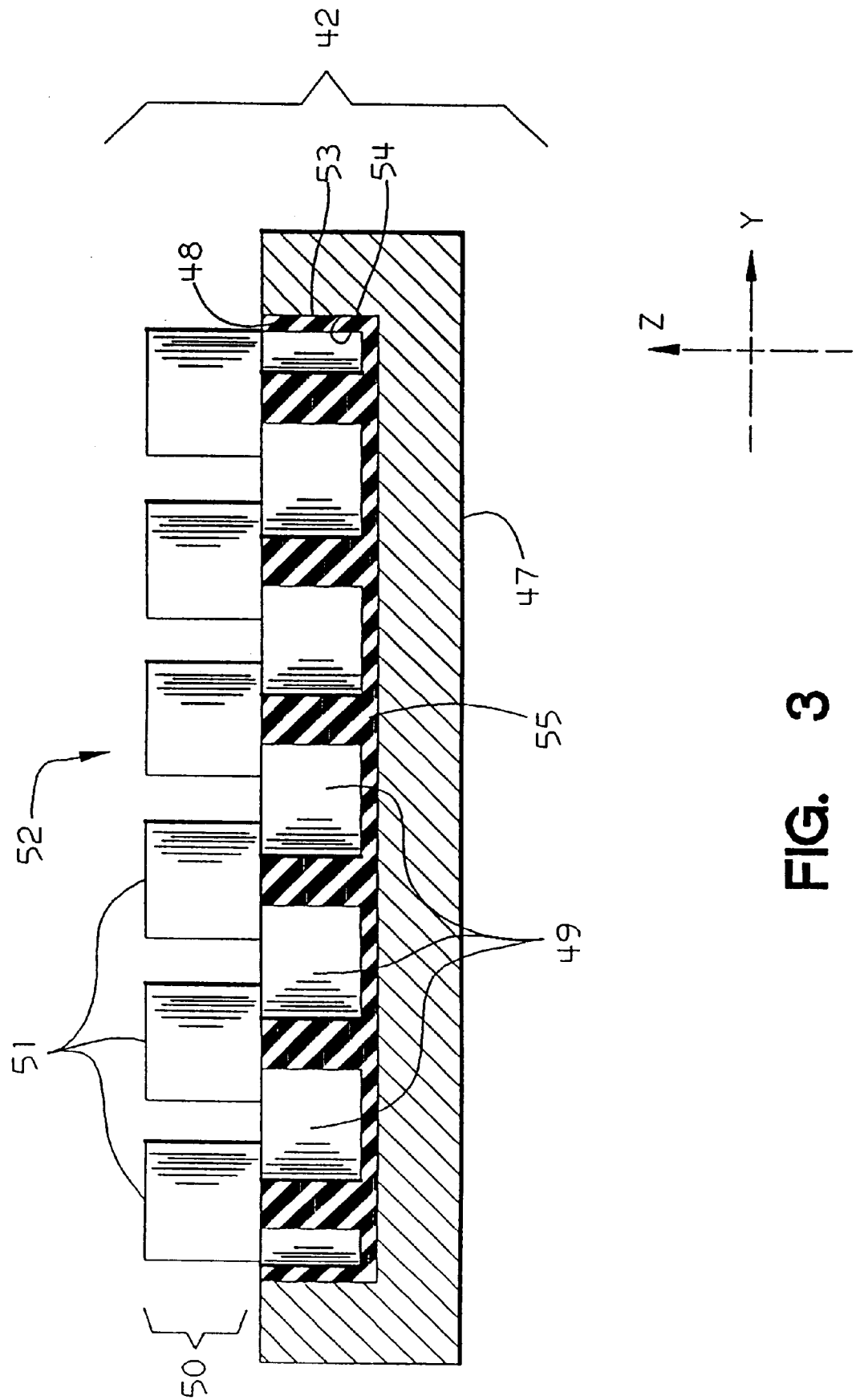
FIG. 3 is an enlarged side elevational view, in section, of the elastomeric structure shown in FIG. 1, as taken along the line 3—3 in FIG. 1.

FIG. 3 is a cross-sectional view of elastomeric structure 42 taken along the line 3—3 in FIG. 1. The elastomeric structure 42 includes a base member 47 with the elastomeric member 52 having the aforedefined first layer 48 with openings 49 therein (through which the cross-sectional view is taken) and the second layer 50 including the defined upstanding projections 51. Openings 49 in first layer 48 may or may not extend completely through to the base member 47 (partial extension shown in FIG. 3). Leaving material (e.g., 55) along the bottom of the first layer 52 increases the total bond area between the elastomeric member 52 and base member 47. Use of partial depth openings 49 also simplifies molding of the part. Specifically, the core pins for openings 49 are not required to extend through to the base member, reducing the tolerances to which these are machined. Either embodiment will perform satisfactorily, in accordance with the teachings herein.

Figure 4:
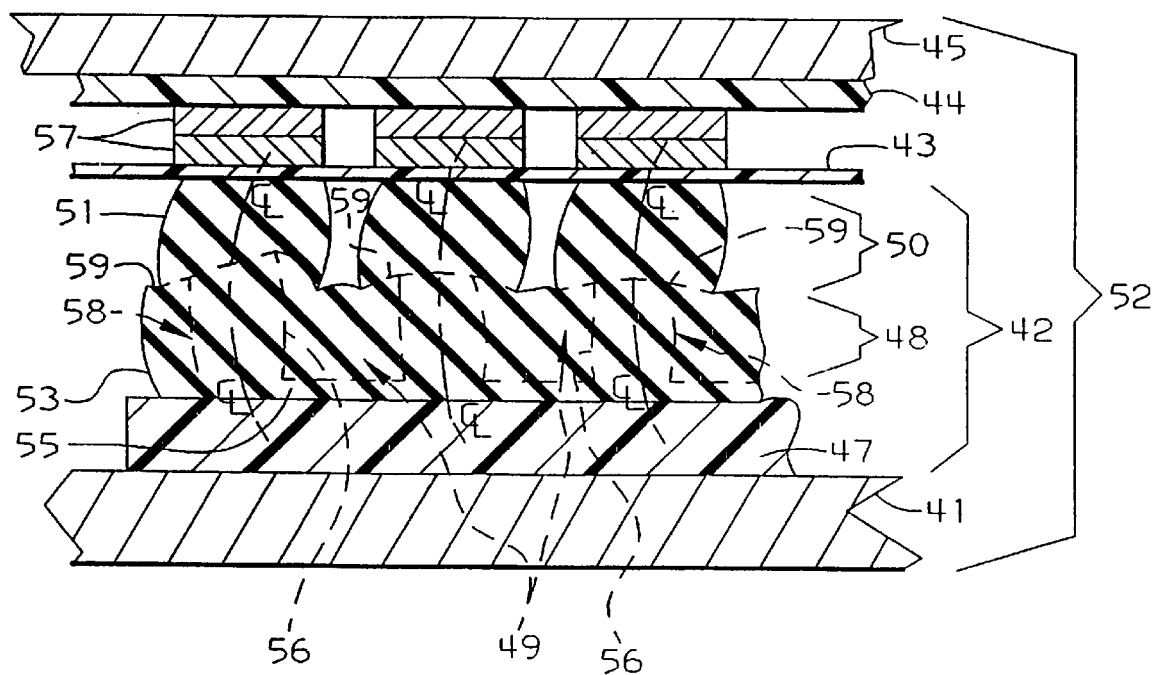
FIG. 4 is a sectional, elevational view of a known, unconstrained elastomeric structure showing the upstanding projection and base layer deflections during compression.
Figure 5:
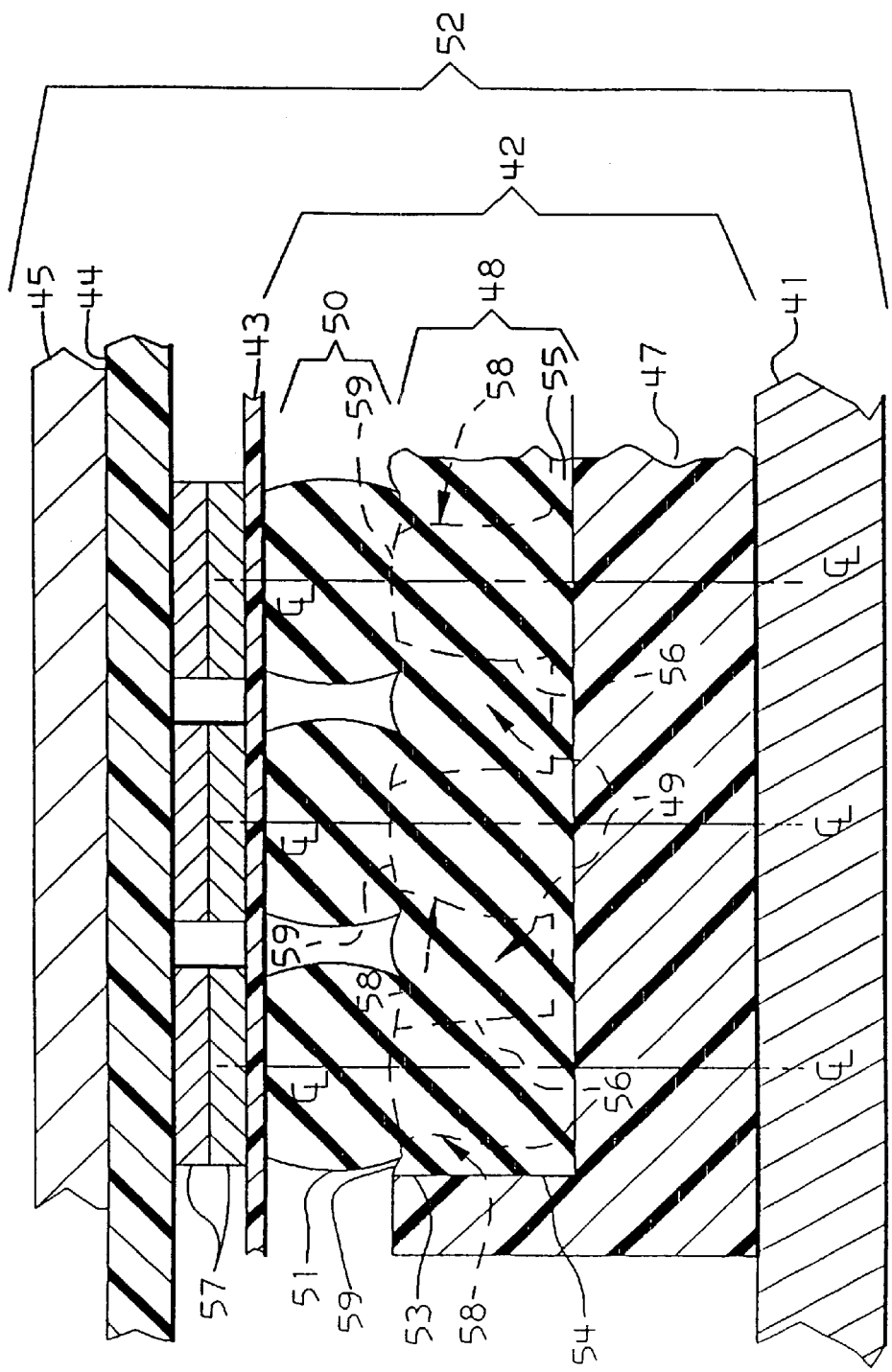
FIG. 5 is a sectional, elevational view of the structure of an embodiment of the present invention during compression.

FIGS. 4 and 5 are sectional views of a known structure and the improved structure of the invention, respectively. The upstanding projections 51 of the elastomeric structure in both views are compressed in the Z (vertical) direction by applying a force to the upper surface (top) of the projections. Attention is directed to FIGS. 1 and 3 for the respective directions being discussed herein. Hidden lines 56 in both views illustrate how the openings 49 in the first layer 48 are deformed during elastomer deformation. The openings of the lower, first layer 48 are so designed to provide a compressive stiffness of the first layer 48 that is approximately equal to the compressive stiffness of the upstanding projections 51, both layers thus possessing substantially similar stiffness properties. When the spring rates of the first and second layers 48 and 50 respectively are so similar, the overall spring rate is one-half that of either layer. In other words, use of two springs (projections 51, first layer 48) doubles the compliancy of the final structure.

A significant difference between the embodiments in FIGS. 4 and 5 is the final shape (after compression) of the connecting webs 58 in the first layers that function to connect the elastomeric material at this location. Openings 49 are thus understood to lie between adjacent webs 58. In FIG. 4, these webs 58 are deformed such that those in one portion are angularly displaced relative to the vertical Z axis, while in FIG. 5, significantly, these webs remain substantially aligned with the Z axis. This difference is caused by the different expansions of the upstanding projections 51, these projections expanding in directions Y (laterally, or substantially horizontally in FIGS. 4 and 5) and X (in a direction toward and away from the viewer in FIGS. 4 and 5) when compressed in the Z axis. The expansion causes the top surface (59) of the first layer 48 to laterally displace toward the lower base member 47. Compression of first layer 48 would normally cause external side 53 of the first layer to expand laterally in the Y direction. As seen in FIG. 4, such displacement of the external surface 53 manifests itself by the movement of both the webs 58 and mid-height plane (represented by surface 59) of the elastomer substantially in the Y direction. Additional lateral displacement of surface 59 increases the bending movement in the elastomer column (i.e., the beam-column or P-delta effect), eventually causing buckling or unstable deformation of the elastomeric member. As is known in the art of beam-column structures, as the lateral deflection (or eccentricity) of the columns increase, the load supporting capacity of the column reaches a maximum and then decreases. As the lateral displacement of surface 59 increases, the maximum force that can be supported by upstanding projecting 51 of FIG. 4 reaches a maximum and then decreases, creating an unstable elastomeric structure, as seen in FIG. 4.

In FIG. 5, however, external side 53 is restrained by sidewall 54 of the rigid base 47 or similar structure, preventing lateral expansion of external side 53 and therefore substantially eliminating lateral motion of surface 59. (Base member 47 is preferably of a thermosetting plastic material while the material for both layers 48 and 50 is silicone rubber.) Since the first layer 48 cannot expand laterally in FIG. 5, the centerlines (CL) of the upstanding projections and the corresponding webs of the first layer remain approximately straight, thereby preventing the increased bending moments of the beam-column or P-delta effect and increasing the applied force that the elastomer columns can support. For homogeneous elastomeric materials, the Poisson's ratio is approximately 0.5 (nearly incompressible). Being substantially incompressible, if the elastomer is constrained and then compressed, the load versus deflection or stiffness of the elastomeric member is approximated by the material's bulk modulus (i.e., it is very stiff). However, in the present invention, the first layer 48 expands into openings 49 of the first layer, allowing the structure to have a much lower stiffness or high compliance (inverse of stiffness). Also, by using uniformly spaced and controlled openings 49 in the first layer, a more consistent elastomeric structure can be developed over foamed elastomers or the like which typically included porous openings or similar voids in the elastomer. As seen in FIG. 5, the sidewall 54 possesses a height substantially similar to the thickness of the corresponding first layer 48. Preferably, this height is at a ratio of about 1:2 to about 1.5:2 in comparison to the overall thickness of both layers 48 and 50. As clearly seen in FIG. 5, the invention does not use alignment pins or the like for aligning the elastomeric's first and second layers 48 and 50, respectively, relative to the base member 47 (or to any other structured elements in FIG. 5).

By way of example, two electrical connector systems as previously described have been built with elastomeric structures 42 as shown in FIGS. 4 and 5. These systems have been constructed using an FR-4 dielectric printed circuit board with copper circuitry for member 44 and a 0.002 inch thick polyimide film for the second circuitized member 43, this member also having metallized circuit lines of copper. The elastomeric members included six upstanding projections in the y direction of FIG. 1 and fifty upstanding projections in the x direction, for a total of 300 upstanding projections. The openings 49 of both first layer 48 and the upstanding projections 51 of both second layers 50 were positioned in a rectangular pattern having a center-to-center dimension of 0.050 inch. The first and second layers possessed equal thicknesses of 0.035 inch, and the base member sidewall 54 (of the embodiment of FIG. 5) possessed a similar height as the thickness of the corresponding first layer 48 (FIG. 5) adjacent thereto. It is therefore clearly seen in FIG. 5 that the base member's sidewall 54 engages only the entire area of external side 53, and nothing more, during compression of the elastomeric and even prior to such compression. As discussed above, the first connector system does not include a sidewall (FIG. 4) nor was suggestive of same. The diameter of each of the upstanding cylindrical projections in both systems was approximately 0.038 inch. The openings 49 in both first layers each had a diameter of approximately 0.035 inch, and were substantially cylindrical. Bonding layers 55 were approximately only 0.005 inches thick. The elastomeric material used was Dow Corning LCS-745 silicone rubber blended with Varox DBPH-50 peroxide (available from the R. T. Vanderbilt Company, Inc. ). These structures were each transfer molded at 350 degrees Fahrenheit, and then post-baked at 375 degrees Fahrenheit for 6 hours. The elastomeric structures were then vulcanized to base member 47 made of a known thermoplastic, in this case Ryton R-4. Ryton R-4 is a registered trademark of Phillips Petroleum. Such vulcanization is not required, in accordance with the teachings herein, however. The elastomeric structure 42 could form an interference fit (i.e., press fit) within base member 47. It is even possible to leave a small gap (e.g., 0.0005 to 0.015 inch) between external side 53 and sidewall 54, provided such a gap is narrow enough to substantially prevent lateral expansion of external side 53 and therefore substantially limit lateral deformation of surface 59. The elastomer could also be adhesively bonded. In both embodiments, a bottom support member 41 of aluminum was utilized.

The known connector system of FIG. 4, when actuated, exhibited buckling or unstable deformation when an average load of 100 grams per upstanding projection was applied. In sharp contrast, the connection system of the present invention could support a load greater than 100 grams average per upstanding projection without exhibiting buckling or unstable load deflection. This testing showed that use of sidewall 54 could prevent buckling or unstable deformation while openings 49 of the first layer 48 provide space for the elastomeric member's deformation, providing an elastically stable structure of high compliancy. That is, the embodiment of FIG. 5 substantially prevented lateral expansion of the elastomeric's side surface while also substantially preventing lateral deflection of both first and second layers of the elastomeric member.

What is claimed is:

1. An elastomeric structure comprising:

an electrically elastomeric member comprised of electrically insulative elastomeric material and including a first layer having a closed bottom layer portion and at least one external side surface, said first layer having a plurality of openings spacedly positioned in said first layer in accordance with a first established pattern and a second layer including a plurality of upstanding projections, said openings extending essentially vertically from an upper surface of said first layer interfacing with said second layer to said closed bottom layer portion, selected ones of said upstanding projections each being located adjacent one or more of said openings in said first layer in accordance with a second established pattern, said electrically insulative elastomeric material within said first layer adapted for deforming and extending into said openings within said first layer during application of force onto said upstanding projections of said second layer, said upstanding projections of said elastomeric member providing contact normal force in response to said application of force onto said upstanding projections of said second layer; and a base member, including an upstanding peripheral sidewall unitarily therewith defining a cavity within said base member, said first layer of said electrically insulative elastomeric member being positioned within said cavity such that said bottom layer portion is located directly on said base member, said sidewall being of a height of only substantially the same as the thickness of said first layer and engaging only the entire external surface area of said external side surface of said first layer of said electrically insulative elastomeric material and not said plurality of upstanding projections of said second layer of said electrically insulative elastomeric material during said application of force onto said upstanding projections of said second layer to substantially prevent lateral expansion of said external side surface of said first layer and lateral deflection of both said first and second layers while said elastomeric member provides said contact normal force, said elastomeric structure not including alignment pins or the like for aligning said elastomeric member within said base member.

2. The elastomeric structure of claim 1 wherein said first and second layers of said elastomeric member are comprised of silicone rubber.

3. The elastomeric structure of claim 1 wherein said first layer of said elastomeric member is of a substantially rectangular shape.

4. The elastomeric structure of claim 1 wherein said first and second layers have a first combined thickness, said ratio of said height of said sidewall to said first combined thickness of said first and second layers of said elastomeric member being within the range of about 1:2 to about 1.5:2.

5. The elastomeric structure of claim 1 wherein said first layer of said elastomeric member has a first thickness and second layer of elastomeric member has a second thickness, said first and second thicknesses being substantially similar.

6. The elastomeric structure of claim 1 wherein said upstanding projections of said second layer are arranged in a substantially rectangular pattern.

7. The elastomeric structure of claim 1 wherein said openings in said first layer of said elastomeric member are of a substantially cylindrical shape.

8. The elastomeric structure according to claim 7 wherein said upstanding projections of said second layer of said elastomeric member are of a substantially cylindrical shape.

9. The elastomeric structure according to claim 8 wherein the number of said openings in said first pattern of said first layer of said elastomeric member have a density substantially within the range of about 100 to 1,250 openings per square inch and said upstanding projections of said second pattern of said second layer of said elastomeric member have a density substantially within the range of about 100 to 1,250 upstanding projections per square inch.

10. The elastomeric structure according to claim 7 wherein said upstanding projections of said second layer of said elastomeric member are of a substantially rectangular shape.

11. The elastomeric structure according to claim 10 wherein the number of said openings in said first pattern of said first layer of said elastomeric member have a density substantially within the range of about 100 to 1,250 openings per square inch and the number of said upstanding projections of said second pattern of said second layer of said elastomeric member have a density substantially within the range of about 100 to 1,250 upstanding projections per square inch.

12. The elastomeric structure of claim 1 wherein said openings in said first layer of said elastomeric member are of a substantially rectangular shape.

13. The elastomeric structure according to claim 12 wherein said upstanding projections of said second layer of said elastomeric member are of a substantially rectangular shape.

14. The elastomeric structure according to claim 13 wherein the number of said openings in said first pattern of said first layer of said elastomeric member have a density substantially within the range of about 100 to 1,250 openings per square inch and the number of said upstanding projections of said second pattern of said second layer of said elastomeric member have a density substantially within the range of about 100 to 1,250 upstanding projections per square inch.

15. The elastomeric structure according to claim 12 wherein said upstanding projections of said second layer of said elastomeric member are of a substantially cylindrical shape.

16. The elastomeric structure according to claim 15 wherein the number of said openings in said first pattern of said first layer of said elastomeric member have a density substantially within the range of about 100 to 1,250 openings per square inch and the number of said upstanding projections of said second pattern of said second layer of said elastomeric member have a density substantially within the range of about 100 to 1,250 upstanding projections per square inch.

17. A connector assembly comprising:

a first circuitized substrate including a first plurality of conductors thereon;

a second circuitized substrate including a second plurality of conductors thereon and adapted for engaging said first plurality of conductors;

an elastomeric structure including an electrically insulative elastomeric member comprised of electrically insulative elastomeric material and having a first layer having a closed bottom layer portion and at least one external side surface, said first layer having a plurality of openings spacedly positioned in said first layer in accordance with a first established pattern and a second layer including a plurality of upstanding projections, said openings extending essentially vertically from an upper surface of said first layer interfacing with said second layer to said closed bottom layer portion, selected ones of said upstanding projections each being located adjacent one or more of said openings in said first layer in accordance with a second established pattern, said electrically insulative elastomeric material within said first layer adapted for deforming and extending into said openings within said first layer during application of force onto said upstanding projections of said second layer, a base member including an upstanding peripheral sidewall unitarily therewith defining a cavity within said base member, said first layer of said elastomeric member being positioned within said cavity such that said bottom layer portion is located directly on said base member, said sidewall being of a height of only substantially the same as the thickness of said first layer and engaging only the entire external surface area of said external side surface of said first layer of said electrically insulative elastomeric material and not said plurality of upstanding projections of said second layer of said electrically insulative elastomeric material during application of force onto said upstanding projections of said second layer to substantially prevent lateral expansion of said external side surface of said first layer and lateral deflection of both said first and second layers, said upstanding projections adapted for aligning with respective ones of said conductors of said second circuitized member and engaging said second circuitized member to provide normal contact force against said second circuitized member in response to said application of force onto said upstanding projections to cause said second circuitized member to exert said force against said conductors of said first circuitized member, said elastomeric structure not including alignment pins or the like for aligning said elastomeric member within said base member; and means for retaining said electrically insulative elastomeric structure against said second circuitized member.

18. The connector assembly of claim 17 wherein said first and second layers of said elastomeric member are comprised of silicone rubber.

19. The connector assembly of claim 17 wherein said first layer of said elastomeric member of said elastomeric structure is of a substantially rectangular shape.

20. The connector assembly of claim 17 wherein said first and second layers have a first combined thickness, said ratio of said height of said sidewall to said thickness of said first and second layers of said elastomeric member of said elastomeric structure being within the range of about 1:2 to 1.5:2.

21. The connector assembly of claim 17 wherein said first and second layers of said elastomeric member of said elastomeric structure are of substantially similar thicknesses.

22. The connector assembly of claim 17 wherein said upstanding projections of said second layer are arranged in a substantially rectangular pattern.

23. The connector assembly of claim 17 wherein said openings in said first layer of said elastomeric member of said elastomeric structure are of a substantially cylindrical shape.

24. The connector assembly according to claim 23 wherein said upstanding projections of said second layer of said elastomeric member are of a substantially cylindrical shape.

25. The connector assembly according to claim 24 wherein the number of said openings in said first pattern of said first layer of said elastomeric member have a density substantially within the range of about 100 to 1,250 openings per square inch and the number of said upstanding projections of said second pattern of said second layer of said elastomeric member have a density substantially within the range of about 100 to 1,250 upstanding projections per square inch.

26. The connector assembly according to claim 23 wherein said upstanding projections of said second layer of said elastomeric member are of a substantially rectangular shape.

27. The connector assembly according to claim 26 wherein the number of said openings in said first pattern of said first layer of said elastomeric member have a density substantially within the range of about 100 to 1,250 openings per square inch and the number of said upstanding projections of said second pattern of said second layer of said elastomeric member have a density substantially within the range of about 100 to 1,250 upstanding projections per square inch.

28. The connector assembly of claim 17 wherein said openings in said first layer of said elastomeric member of said elastomeric structure are of a substantially rectangular shape.

29. The connector assembly of claim 28 wherein said upstanding projections of said second layer of said elastomeric member are of a substantially rectangular shape.

30. The connector assembly according to claim 29 wherein the number of said openings in said first pattern of said first layer of said elastomeric member have a density substantially within the range of about 100 to 1,250 openings per square inch and the number of said upstanding projections of said second pattern of said second layer of said elastomeric member have a density substantially within the range of about 100 to 1,250 upstanding projections per square inch.

31. The connection assembly according to claim 28 wherein said upstanding projections of said second layer of said elastomeric member are of a substantially cylindrical shape.

32. The connector assembly according to claim 31 wherein the number of said openings in said first pattern of said first layer of said elastomeric member have a density substantially within the range of about 100 to 1,250 openings per square inch and the number of said upstanding projections of said second pattern of said second layer of said elastomeric member have a density substantially within the range of about 100 to 1,250 upstanding projections per square inch.

33. The connector assembly of claim 17 wherein said first circuitized substrate comprises a printed circuit board including a dielectric layer and said plurality of said conductors each comprise a conductive pad positioned in a predetermined pattern on said dielectric layer.

34. The connector assembly of claim 33 wherein said second circuitized substrate comprises a flexible circuit including a flexible dielectric layer and said second plurality of conductors each comprise a conductive pad located on said flexible dielectric layer.

35. An information handling system including a connector assembly as part thereof, said connector assembly comprising:
- a first circuitized substrate including a first plurality of conductors thereon;
- a second circuitized substrate including a second plurality of conductors thereon and adapted for engaging said first plurality of conductors;
- an elastomeric structure including and electrically insulative elastomeric member comprised of electrically insulative elastomeric material having a first layer having a closed bottom layer portion and at least one external side surface, said first layer having a plurality of openings spacedly positioned in said first layer in accordance with a first established pattern and a second layer including a plurality of upstanding projections, said openings extending essentially vertically from an upper surface of said first layer interfacing with said second layer to said closed bottom layer portion, selected one of said upstanding projections each being located adjacent one or more of said openings in said first layer in accordance with a second established pattern, said electrically insulative elastomeric material within said first layer adapted for deforming and extending into said openings with said first layer during application of force onto said upstanding projections of said second layer, a base member including an upstanding peripheral sidewall unitarily therewith defining a cavity within said base member, said first layer of said electrically insulative elastomeric member being positioned within said cavity such that said bottom layer portion is located directly on said base member, and sidewall being of a height of only substantially the same as the thickness of said first layer and engaging only the entire external surface area of said external side surface of said first layer of said elastomeric material and not said upstanding projections of said second layer of said electrically insulative elastomeric material during application of force onto said upstanding projections of said second layer to substantially prevent lateral expansion of said external side surface of said first layer and lateral deflection of both said first and second layers, said upstanding projections adapted for aligning with respective ones of said conductors of said second circuitized member and engaging said second circuitized member to provide normal contact force against said second circuitized member in response to said application of force onto said upstanding projections to cause said second circuitized member to exert said force against said conductors of said first circuitized member, said elastomeric structure not including alignment pins or the like for aligning said elastomeric member within said base member; and
- means for retaining said electrically insulative elastomeric structure against said second circuitized member.

* * * * *